United States Patent [19]

Naito et al.

[11] 4,107,731
[45] Aug. 15, 1978

[54] SILICON DOPED WITH CADMIUM TO REDUCE LIFETIME

[75] Inventors: Masayoshi Naito; Tatsuya Kamei, both of Hitachi, Japan

[73] Assignee: Hitachi, Ltd., Japan

[21] Appl. No.: 668,400

[22] Filed: Mar. 19, 1976

[30] Foreign Application Priority Data

Mar. 24, 1975 [JP] Japan ................................. 50-34370

[51] Int. Cl.² .......................................... H01L 29/167
[52] U.S. Cl. ...................................... 357/64; 357/38; 148/190
[58] Field of Search .................................. 357/63, 64

[56] References Cited

U.S. PATENT DOCUMENTS 3,514,675  5/1970  Purdom ................................. 357/64
3,821,784  6/1974  Heald et al. ............................ 357/34

OTHER PUBLICATIONS

Gulamova et al., "Cadmium Levels in Silicon", Soviet Physics–Semiconductors, vol. 5, No. 4, Oct. 1971, pp. 687–689.
Lebedev et al. Sov. Physics–Semicond., vol. 2, No. 12, Jun. 1969, pp. 1543–1544.
Holm-Kennedy et al., Appl. Phys. Lett., vol. 22, No. 4, Feb. 15, 1973, pp. 167–169.

*Primary Examiner*—William D. Larkins
*Attorney, Agent, or Firm*—Craig & Antonelli

[57] ABSTRACT

A semiconductor device is doped with a multiple acceptor impurity having a monovalent energy level for forming a recombination center of carriers within the semiconductor body, and at least one multivalent energy level for capturing carriers within a depletion layer of a PN junction of the semiconductor body.

1 Claim, 2 Drawing Figures

SILICON DOPED WITH CADMIUM TO REDUCE LIFETIME

BACKGROUND OF THE INVENTION

1. Field of the Invention

The present invention relates to a semiconductor device which comprises a semiconductor body doped with an impurity to form a carrier recombination center.

2. Description of the Prior Art

In the art of a high speed semiconductor device, it has been the practice to diffuse into a semiconductor body an impurity forming a carrier recombination center as a lifetime killer in order to attain high switching speed. For the purpose of describing the prior art relating to the lifetime killer, the mechanism of the carrier recombination will now be considered.

Carrier recombination through the recombination center is accomplished when either electrons or holes, e.g. excess electrons in a conduction band are first captured by unoccupied impurity ions which have not captured electrons and then excess holes in a valence band are captured by the impurities. In this case, if the impurity which has captured the electron releases that captured electron to the conduction band before it captures the hole, no recombination occurs. Since the rate of the release of the electron from the impurity ion increases as an energy level which the impurity defines in a band gap of a semiconductor body approaches the conduction band, the rate of carrier recombination is small when the energy level is close to the conduction band. On the other hand, if the energy level approaches the valence band, many of the impurities are filled with electrons resulting in a decrease in the amount of nonoccupied impurities which can capture excess electrons. Therefore, in this case, the rate of recombination also decreases.

While the above explanation has been made in connection with electrons, the same is applicable to holes. Thus, when the energy level of the impurity lies near the center of the band gap, the rate of carrier recombination is maximum and the lifetime of the carrier is minimum. For this reason, as a lifetime killer, an impurity with a deep energy level, in other words, an impurity an energy level of which lies near a center of a band gap has been used heretofore. A typical example is gold in a silicon semiconductor. When the impurity of a deep energy level is used as the lifetime killer, the lifetime of the carrier can be shortened but there exists a drawback of increased leakage current at a junction. This can be understood when considering that the high rate of recombination of excess carriers (excess electrons and holes) also means a higher generation rate of carriers in a depletion layer near the junction. On the other hand, if one uses an impurity having a shallow energy level to reduce the leakage current at the junction, the effect of shortening the lifetime is sacrificed for the reason described above. Furthermore, the rate of the emission of electrons or holes from the impurity ions increases with temperature, and since the effect of the emission of electrons or holes to the recombination is significant when the energy level is shallow and the rate of recombination decreases with the increase of the rate of emission, a device having a shallow energy level lifetime killer diffused therein has another drawback of an extended lifetime at an elevated temperature resulting in an extended reverse recovery time of the junction.

It is desirable to use, as a lifetime killer, an impurity which effectively functions only as a recombination center for the excess carrier and has no or little additional functions. However, the above requirements of short lifetime of the carrier, no extension of the life time at a high temperature, and small leakage current at the junction are competing factors in the lifetime killers which heretofore have been available, and it has been very difficult to meet the requirements simultaneously.

SUMMARY OF THE INVENTION

It is an object of the present invention to provide a novel semiconductor device which is capable of operating at a high speed at a high temperature and has a small leakage current at a junction.

A feature of the present invention resides in that an impurity capable of assuming at least one multivalent level in a band gap of a semiconductor is distributed in a semiconductor body as a lifetime killer. In the multivalent energy level, capture cross sections for the electrons and holes considerably differ so that the impurity in the depletion layer tends to function not as the recombination and generation center of carriers but as a mere capture center. The present invention makes use of such a tendency, in which the recombination of the excess carriers is effected by means of one or both of positive monovalent and negative monovalent deep energy levels, and the generation of the carriers in the depletion layer is extremely suppressed causing multivalent energy level to capture the carriers.

DESCRIPTION OF THE PREFERRED EMBODIMENTS

Figure 1:
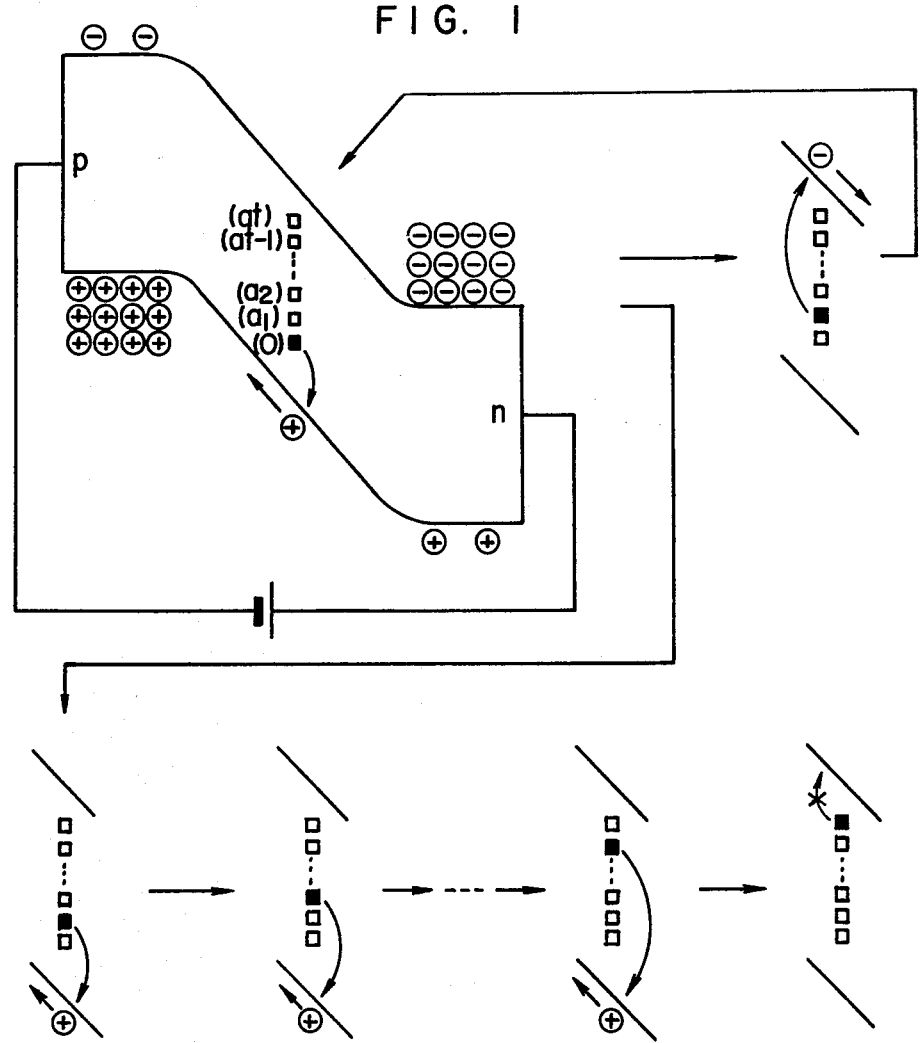
FIG. 1 shows generation of carriers through a multivalent impurity in a reverse biased depletion layer.

The present invention will be described in detail in connection with the lifetime at a low injection, the lifetime at a high injection and the junction leakage current. The symbols used herein will first be explained. $(dl)$ indicates an impurity in the + 1-valent donor state, $(O)$ indicates an impurity in the neutral state, $(am)$ indicates an impurity in the -m-valent acceptor state, $N^{-m}$ indicates an impurity density in the $(am)$ state, $N_{tr}$ indicates impurity density, $V_{th}$ indicates the thermal velocity of carriers, Nv is the effective state density of the valence band, Nc is the effective state density of the conduction band, $n_i$ is the intrinsic carrier density, Ev is the energy at the top of the valence band, Ec is the energy at the bottom of the conduction band, Eg represents band gap, Edl is the energy in the $(dl)$ state, Eam is the energy in the $(am)$ state, $E_{FO}$ is the Fermi level at thermal equilibrium, $\sigma_p^{-m}$ is the hole capture cross section in the $(am)$ state, $\sigma_n^{-m}$ is the electron capture cross section in the $(am)$ state, $\sigma_p^{+l}$ is the hole capture cross section in the $(dl)$ state, $\sigma_n^{+l}$ is the electron capture cross section in the $(dl)$ state, k is Boltzmann's constant, T is absolute temperature, s is the highest valent number of the impurity in donor state, and $-t$ is the highest valent number of the impurity in acceptor state.

Since power semiconductor devices are generally used at a high injection level, the reverse recovery time of the junction is governed by a lifetime of the high injection level. Before considering the lifetime at high injection, however, the lifetime at a low injection will be first considered. The energy at each valence state of an impurity having multiple valence levels is such that it increases as the valence number decreases for donor states, and as the absolute value of the valence number increases for acceptor states. The states are arranged in ascending order of energy as follows: $(dl)$, $(dl-1)$, ... $(d\,1)$, $(0)$, $(a\,1)$, ... $(am-1)$, $(am)$. As an example, an impurity having a multiple valence levels which is at most monovalent for the donor state, that is, an impurity capable of assuming the states of $(d1)$, $(0)$, $(a1)$, $(a2)$, ... $(am)$ or $(0)$, $(a1)$, $(a2)$, ... $(am)$ in the band gap, will be considered. In case of low injection, the carrier distribution can be substantially represented by the Fermi level $E_{FO}$ at thermal equilibrium, and if $E_{FO}$ is above $E_{am}$ the impurity is in the $(am)$ state, but if $m \geq 2$, although $(am)$ changes to $(am - 1)$ by the capture of the excess holes, the electron capture in $(am - 1)$ shows small capture cross section because of repulsion force, and hence the rate of recombination is small. Therefore, when it is necessary to shorten the lifetime at low injection, it is desirable to meet the requirement $$E_{FO} < E_{a2} \quad (1)$$

Namely, in order for the impurity of the present example to be used as a lifetime killer, it is generally preferable to be applied to a semiconductor device having a P-type base region. When the requirement (1) is met, the carrier recombination is effected through $-1$ or $+1$ - valent level. It is to be understood that the deeper those levels are the larger is the rate of recombination. As another example, an impurity having multiple valence levels which is at most monovalent for the acceptor state, that is, an impurity capable of assuming the states of $(d1), \ldots (d2), (d1), (0), (a1)$ or $(d1), \ldots (d2), (d1), (0)$, is considered. In a similar way, the requirement $$E_{d2} < E_{FO} \quad (2)$$

is desirable and the deeper the $+1$ or $-1$ valent level is, the larger is the rate of recombination. From the requirement 2, it is generally preferable to apply the impurity of the present example to a semiconductor device having an N-type base region. As a further example, an impurity which is multivalent for both donor and acceptor states, that is, an impurity capable of assuming the states of $(d1), \ldots (d2), (d1), (0), (a1), (a2), \ldots (am)$ in the band gap, will be considered. In a similar way, it is desirable that both of the above requirements 1 and 2 are met for the impurity. Therefore, it is generally preferable to apply the impurity of the present example to a semiconductor device having a base region of high resistivity. The above limitations to the conductivity type of the semiconductor can be eliminated by simultaneously diffusing into the body an impurity which is at most monovalent for the donor and an impurity which is at most monovalent for the acceptor, because, in such a case, the effects of two impurities to the recombination supplement each other.

The lifetime at the high injection is next considered. At high injection, all of the impurity states in the band gap are realized at a given proportion, and in the impurity according to the present invention at least one of $+1$ or $-1$-valent state is realized so that the carrier recombination occurs through the level of that state. No recombination occurs through the multivalent level as in the case of low injection. Therefore, in addition to the carrier density, only the parameters relating to the $\pm 1$ valent level concerns the carrier lifetime. Of those parameters, the hole density $P_{d1}$ and the electron density $n_{d1}$ which would be in valence and conduction bands respectively if the Fermi level is at $+1$ valent impurity level, and the hole density $P_{a1}$ and the electron density $n_{a1}$ which would be in valence and conduction bands, respectively, if the Fermi level is at $-1$ valent impurity level, are sensitively dependent on temperature. When those parameters significantly contribute to the lifetime, the lifetime greatly depends on the temperature so that the lifetime at high temperature is extended. On the other hand, if the $\pm 1$ valent level is sufficiently deep and $P_{d1}$, $n_{d1}$, $P_{a1}$ and $n_{a1}$ are sufficiently small to be neglected with respect to the carrier density, the lifetime does not depend on the above parameters and the temperature-dependence of the lifetime is small. The requirement of deep level for the $\pm 1$ valence corresponds to the requirement for shortening the lifetime at the low injection described above. This will now be explained quantitatively.

In an acceptor type impurity having no $+1$ valent level, that is an impurity capable of assuming the states of $(0)$, $(a1)$, $(a2)$, ... $(am)$ in the band gap, the requirement is;

$$P_{a1}, n_{a1} << P \quad (3)$$

where P is the carrier density. Since P is in the order of $10^{15}$ cm$^{-3}$ at the injection of current density of several A/cm$^2$, and P is larger in a power semiconductor device, if the requirement $$P_{a1}, n_{a1} << 10^{15} \quad (4)$$

is met, the requirement 3 can be generally met. Placing the following expression in (4), $$P_{a1} = N_v \cdot \exp\{(E_v - E_{a1})/kT\}$$
$$n_{a1} = N_c \cdot \exp\{(E_{a1} - E_c)/kT\} \quad (5)$$

then we can obtain $$E_v + kT \cdot \ln \frac{N_v}{10^{15}} < E_{a1} <$$
$$E_c - kT \cdot \ln \frac{N_c}{10^{15}} \quad (6)$$

The same discussion is applicable to the other example, that is a donor type impurity having no $-1$ valent level, i.e. an impurity capable of assuming the states $(d1), \ldots (d2), (d1), (0)$ in the band gap, or an impurity having both $+1$ and $-1$ valent levels. When the energies of both levels for the impurity capable of assuming both $+1$ and $-1$ valent levels, or the energy of the possible level for the impurity capable of assuming either one of the two levels, lie in the range defined by:

$$(E_v + kT \ln \frac{N_v}{10^{15}}, E_c - kT \ln \frac{N_c}{10^{15}}) \quad (7)$$

then the temperature-dependence of the lifetime is small. Since the range defined by (7) is narrowed as the temperature rises, if the energy level is within the range of (7) at a given temperature such as 400° K which is an upper limit of operating temperature of an actual device, the energy will be always within the range of (7) at lower temperature.

Finally, the junction leakage current is explained in conjunction with the present invention. Considering the change of state of the impurity by the capture and emission of the carriers, when the impurity is in its depletion layer, the number of the carriers is very small and the capture of the carriers may be neglected with respect to the emission of the carriers. As an example, considering an impurity having multiple valence levels which is at most monovalent for the donor state, the transition between the $(am)$ and $(am + 1)$ occurs such that $(am)$ is changed to $(am + 1)$ by the emission of the holes and $(am + 1)$ is changed to $(am)$ by the emission of the electrons. A probability of the emission of electrons by $(am + 1)$ is proportional to a probability of the capture of the electrons by the $(am)$ according to a principle of detailed balance. Since $(am)$ is charged to $-m$ valence, interaction of the impurities in this state and the electrons results in an electrical repulsion force so that the electron capture cross section of $(am)$ is very small and the probability of the emission of electrons by $(am + 1)$ is very small. On the other hand, since the interaction of the impurities in the $(am + 1)$ state and the holes results in electrical attraction force, the hole capture cross section of $(am + 1)$ is large and the probability of the emission of holes by $(am)$ is large. As for the transitions between $(d1)$, $(0)$ and $(a1)$, the interaction of the impurities and the carriers is electrically neutral or attractive and there is not much difference between the capture cross sections of the electrons and holes so that the transitions both by the emission of electrons and by the emission of holes occur between those states. In summary when the ratios of capture cross sections of multivalent levels for electrons and holes are very large, the following chart can be given for the transition between the states.

$$(0) \rightleftarrows (a1) \rightarrow (a2) \rightarrow \ldots \rightarrow (at-1) \rightarrow (at) \quad (8)$$

or $$(d1) \rightleftarrows (0) \rightleftarrows (a1) \rightarrow (a2) \rightarrow \ldots (at-1) \rightarrow (at)$$

where the arrow indicates the change of state of the impurity to the indicated direction. In the state which is at a level higher than $(a1)$, the transition occurs in one direction. Accordingly, when the junction is reverse biased and the carriers near the junction decrease, the impurity state assumes the steady state of $(at)$ in the time of change of $(am) \rightarrow (am + 1)$. Once it assumes the steady state, no carrier is generated and hence the leakage current is very small.

The formula (8) is illustrated in FIG. 1. In the figure, a junction is reverse biased, and squares in the depletion layer denote the states which the impurity will assume in the band gap. A solid square indicates the impurity assuming one of the states, and symbols $\oplus$ and $\ominus$ denote holes and electrons, respectively.

In the formula (8), the transition between the higher levels is assumed to occur in one direction because the difference between the electrons and holes at higher level is very large. The conditions therefor are described below. At the steady state, the possibility of assuming the impurity states $(at - 1)$ or $(at)$ is highest as seen from the formula (8). Accordingly, those two states are considered. The change rate per unit time at which $(at - 1)$ emits the holes to shift to $(at)$ is given by:

$$G_p = V{th} \, N^{-(t-1)} \sigma_p^{-t} Pat \quad (9)$$

where $$Pat = N_v \exp\{(E_v - E_{at})/kT\} \quad (10)$$

(See C.T. Sah & W. Shockley: Phys. Rev. 109. 1103 - 1115 (1958)). The change rate per unit time at which $(at)$ emits electrons to shift to $(at - 1)$ is given by:

$$G_n = V_{th} N^{-t} \sigma_n^{-(t-1)} n_{at} \quad (11)$$

where $$n_{at} = N_c \exp\{(E_{at} - E_c)/kT\} \quad (12)$$

From the formulas (9) and (11), a rate equation for the state change of the impurity is derived and by solving it at the steady state a carrier generation rate in the depletion layer is given by:

$$G = G_p = G_n = \frac{V_{th} N_{tr} \sigma_n^{-(t-1)} \sigma_p^{-t} n_i^2}{P_{at}\sigma_p^{-t} + n_{at}\sigma_n^{-(t-1)}} \quad (13)$$

Thus if $\sigma_n^{-(t-1)}$ is sufficiently small with respect to $\sigma_p^{-t}$ and the requirement of;

$$P_{at}\sigma_p^{-t} >> n_{at}\sigma_n^{-(t-1)} \quad (14)$$

is met, then the formula (13) is given by $$G = V_{th} N_{tr} \sigma_n^{-(t-1)} \frac{n_i^2}{P_{at}} = \quad (15)$$
$$V_{th} N_{tr} \sigma_n^{-(t-1)} n_{at} << V_{th} N_{tr} \sigma_p^{-t} P_{at}$$

Since $\sigma_p^{-t}$ is the hole capture cross section at $(at)$ state and it is comparable to the electron or hole capture cross section concerning the transition of $(d1) \rightleftarrows (0) \rightleftarrows (a1)$, the right hand term of the formula (15) represents the carrier generation of normal rate. The formula (14) also means that $Gp >> Gn$ in a transient state in which $N^{-(t-1)}$ and $N^{-t}$ are the same order of magnitude. Accordingly, it is seen that if the requirement of the formula (14) is met, the transition between $(at-1)$ and $(at)$ is in one direction and the steady state carrier generation in the depletion layer is small. By substituting the formulas (10) and (12) in the formula (14), it is seen that the formula (14) is met if the energy in the (at) state meets the requirement of:

$$E_c - E_{at} > \frac{E_g}{2} + \frac{kT}{2} \left( \ln \frac{N_c}{N_v} - \ln \frac{\sigma_p^{-t}}{\sigma_n^{-(t-1)}} \right) \quad (16)$$

In actuality, unless the requirement similar to (16) is met in the course of the formula (8), the one-way transitions between higher levels as shown in the formula (8) are not attained. However, since the energy of the acceptor level increases with the valence number and repulsion force to the electrons increases with the valence number, the relations of $E_{am} \leq E_{at}$, $$\sigma_n^{-(m-1)} > \sigma_n^{-m}, \sigma_p^{-m} \leq \sigma_p^{-(m+1)}.$$

that is, $$E_c - E_{am} \geq E_c - E_{at}, 1 < (\sigma_p^{-t}/\sigma_n^{-t}) \leq (\sigma_p^{-m}/\sigma_n^{-(m-1)})$$

are met. Accordingly, by substituting the formula (16) with:

$$E_c - E_{at} > \frac{E_g}{2} + \frac{kT}{2} (\ln \frac{N_c}{N_v} - \ln \frac{\sigma_p^{-2}}{\sigma_n^{-1}}) \quad (17)$$

the following formula is derived:

$$E_c - E_{am} \geq E_c - E_{at} \quad (18)$$
$$> \frac{E_g}{2} + \frac{kT}{2} (\ln \frac{N_c}{N_v} - \ln \frac{\sigma_p^{-2}}{\sigma_n^{-1}})$$
$$\geq \frac{E_g}{2} + \frac{kT}{2} (\ln \frac{N_c}{N_v} - \ln \frac{\sigma_p^{-m}}{\sigma_n^{-(m-1)}})$$

Thus, it is seen that the requirement similar to the formula (16) is met in the course of the formula (8). Furthermore, while the difference between $N_c$ and $N_v$ is at most one order of magnitude, the difference between $\sigma_p^{-2}$ and $\sigma_n^{-1}$ is several orders of magnitude. Thus, the quantity in the parenthesis in the right hand term of the formula (17) is negative so that if the requirement of the formula (17) is met at room temperature the formula (17) is always met at higher temperature. Accordingly, if an impurity whose highest valent acceptor level meets the formula (17) at room temperature is used as the lifetime killer, carrier generation in the depletion layer is very small.

As another example of the impurity, a multivalent impurity which is at most monovalent for the acceptor state is considered. In a similar way, if the requirement of:

$$E_{ds} - E_v > \frac{E_g}{2} + \frac{kT}{2} (\ln \frac{N_v}{N_c} - \ln \frac{\sigma_n^{+2}}{\sigma_p^{+1}}) \quad (19)$$

is met at room temperature, generation of the carrier in the depletion layer is very small. As a further example of the impurity, an impurity having multiple valent levels for both donor and acceptor states is considered. In this case, if the donor and acceptor levels at the highest valence level meet the requirements of the formulas (17) and (19), that is, when $$E_v + \frac{E_g}{2} + \frac{kT}{2} (\ln \frac{N_v}{N_c} - \ln \frac{\sigma_n^{+2}}{\sigma_p^{+1}}) < E_{ds} - E_{at}$$
$$< E_c - \frac{E_g}{2} - \frac{kT}{2} (\ln \frac{N_c}{N_v} - \ln \frac{\sigma_p^{-2}}{\sigma_n^{-1}}) \quad (20)$$

is met, the carrier generation is small.

Specific examples of the present invention are given below.

EXAMPLE 1

In this example, an impurity capable of assuming $-1$ and $-2$ valent levels in the band gap of silicon is diffused in a silicon semiconductor body. For the silicon at room temperature, $E_g = 1.1$ eV, $N_c = 2.8 \times 10^{19}$ cm$^{-3}$, $N_v = 1.02 \times 10^{19}$ cm$^{-3}$, and $\sigma_p^{-2}/\sigma_n^{-1}$ is in general in the order of $10^5$. Thus, the formula (17) may be written as:

$$E_{a2} < E_c - 0.42 \text{ eV} \quad (21)$$

Furthermore, at 400° K, $N_c = 4.3 \times 10^{19}$ cm$^{-3}$ and $N_v = 1.6 \times 10^{19}$ cm$^{-3}$. Thus, the formula (7) can be written as:

$$E_v + 0.34 \text{ eV} < E_{a1} < E_c - 0.37 \text{ eV} \quad (22)$$

Namely, if $E_{a1}$ and $E_{a2}$ lie in the range as defined by the formulas (21) and (22), the junction leakage current is small and the increase of the lifetime at the high injection at high temperature is small until around 400° K. A particular impurity which meets the above requirements is cadmium (Cd). It has $-1$ and $-2$ valent levels in the band gap of silicon and the energies of these levels are $E_{a1} = E_v + 0.55$ eV and $E_{a2} = E_c - 0.45$ eV (M.A. Gulamova, I.Z. Karimova & P.I. Knigin: Sov. Phys - Semicond. 5, 687 (1971)), which are very deep.

EXAMPLE 2

In this example, an impurity capable of assuming $+1$ and $+2$ valent levels is diffused into a silicon body. In a similar way, from the formula (19), $$E_{d2} > E_v + 0.40 \text{ eV} \quad (23)$$

is derived, and from the formula (7), $$E_v + 0.34 \text{ eV} < E_{d1} < E_c - 0.37 \text{ eV} \quad (24)$$

is derived. An example of the impurity which meets the formulas (23) and (24) is iron (Fe).

EXAMPLE 3

Figure 2:
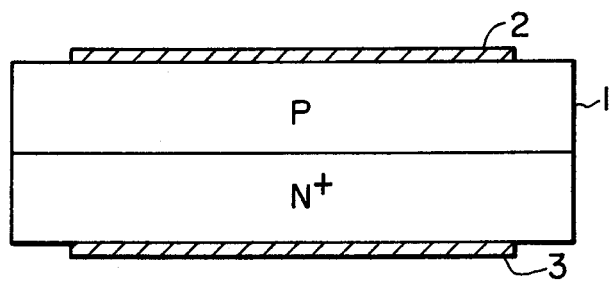
FIG. 2 is a cross-sectional view of a semiconductor device in accordance with this invention.

A diode such as shown in FIG. 2 is considered as an example of the semiconductor device. In FIG. 2, reference numeral 1 designates a semiconductor substrate having a P type layer and an N$^+$ type layer, and reference numerals 2 and 3 designate a pair of main electrodes in ohmic contact with the surface of the P type and N$^+$ type layers, respectively. An N$^+$P diode having cadmium diffused therein as the lifetime killer has a small leakage current, a short lifetime at the high injection and a short reverse recovery time from the high injection, and at the same time since the conductivity type of the base is P-type and the impurity is of $-1$ and $-2$ valent levels, it has a short lifetime at the low injection, and small temperature-dependence of the reverse recovery time.

EXAMPLE 4

In a silicon thyristor having cadmium diffused therein, it has a high forward blocking voltage, is stable at high temperature and has a short turnoff time at high temperature. In a semiconductor device, such as a thyristor, which has two or more base regions of opposite conductivity types, both cadmium and iron may be diffused into the device so that the lifetime at the low injection can also be shortened.

While cadmium and iron have been explained as particular examples of the impurity and silicon diode and silicon thyristor have been explained aas the semiconductor device, it should be understood that the semiconductor body, impurity and semiconductor devices used in the present invention are by no means limited to the illustrated examples.

As described hereinabove, the present invention can offer the following advantages: (1) The carrier lifetime is short and the junction leakage current is small. Consequently, a high speed device with high breakdown voltage is facilitated. Furthermore, since heat loss is small, the operation of the device at high temperature is allowed. (2) The rate of extension of the carrier lifetime at high temperature is small. Consequently, a diode embodying the present invention has a short reverse recovery time at high temperatures and a thyristor embodying the present invention has a short turn-off time at high temperatures.

We claim:

1. A semiconductor device comprising a silicon semiconductor body having a first layer of N type conductivity and a second layer of P type conductivity adjacent to said first layer so as to form a PN junction between said first and second layers, said second layer having a higher resistivity than that of the first layer, and said second layer being doped with cadmium for imparting a short reverse recovery time of the PN junction to the device.

* * * * *